US011566992B2

(12) United States Patent
Qu et al.

(10) Patent No.: US 11,566,992 B2
(45) Date of Patent: Jan. 31, 2023

(54) METHOD AND DEVICE FOR CHARACTERIZING MICROBIAL CARBONATE PORES, AND SERVER

(71) Applicant: Southwest Petroleum University, Chengdu (CN)

(72) Inventors: Haizhou Qu, Chengdu (CN); Anping Hu, Chengdu (CN); Yunfeng Zhang, Chengdu (CN); Wei Chen, Chengdu (CN); Dongfan Yang, Chengdu (CN); Benjian Zhang, Chengdu (CN); Yingjie Chen, Chengdu (CN); Shiyin Li, Chengdu (CN); Xi Cheng, Chengdu (CN); Xuguang Sha, Chengdu (CN)

(73) Assignee: Southwest Petroleum University

( * ) Notice: Subject to any disclaimer, the term of this patent is extended or adjusted under 35 U.S.C. 154(b) by 402 days.

(21) Appl. No.: 17/009,104

(22) Filed: Sep. 1, 2020

(65) Prior Publication Data
US 2021/0063298 A1 Mar. 4, 2021

(30) Foreign Application Priority Data
Sep. 2, 2019 (CN) .......................... 201910826417.6

(51) Int. Cl.
*G01N 15/08* (2006.01)
*G01N 23/2251* (2018.01)
(Continued)

(52) U.S. Cl.
CPC ....... *G01N 15/088* (2013.01); *G01N 23/2251* (2013.01); *G01N 24/08* (2013.01); *G01N 24/081* (2013.01); *H01J 37/28* (2013.01)

(58) Field of Classification Search
CPC .. G01N 15/088; G01N 15/08; G01N 15/0806; G01N 23/2251; G01N 24/08; G01N 24/081; G01N 33/24; E21B 49/02
See application file for complete search history.

(56) References Cited

U.S. PATENT DOCUMENTS

| 10,161,891 | B1* | 12/2018 | Tian ........................ G01N 33/24 |
| 2013/0259190 | A1* | 10/2013 | Walls .................. G01N 33/2823 |
| | | | 382/109 |
| 2016/0025895 | A1* | 1/2016 | Ziauddin .............. G01V 99/005 |
| | | | 702/11 |

FOREIGN PATENT DOCUMENTS

| CN | 101556703 A | 10/2009 |
| CN | 102222359 A | 10/2011 |
| (Continued) | | |

OTHER PUBLICATIONS

First Office Action, Chinese Patent Application No. 201510169106. 9, Jul. 2, 2021, (Original Chinese Language and English Translation, enclosed.).

(Continued)

*Primary Examiner* — Benjamin R Schmitt
(74) *Attorney, Agent, or Firm* — Bretton L. Crockett; TechLaw Ventures, PLLC (57) ABSTRACT

A method and device for characterizing microbial carbonate pores, and a server. Acquiring a user's detailed observational description of a profile of a microbial carbonate to be analyzed, and determining a full-diameter core sample on the microbial carbonate; performing pore characterization and a first pore test on the full-diameter core sample to determine a centimeter-scale pore parameter; determining a sampling position on the full-diameter core sample, and sampling on the full-diameter core sample to obtain a plunger sample; performing a second pore test on the plunger sample to determine a millimeter-scale pore parameter; determining a sampling position on the plunger sample according to the millimeter-scale pore parameter, and sampling on the plunger sample to obtain a scanning electron microscope (SEM) sample and a casting thin section sample; and performing a pore test on the SEM sample and the (Continued)

casting thin section sample to determine a micron-to-nanoscale pore parameter.

14 Claims, 5 Drawing Sheets (51) Int. Cl.
*G01N 24/08* (2006.01)
*H01J 37/28* (2006.01)

(56) References Cited

FOREIGN PATENT DOCUMENTS

CN 103575751 A 2/2014
CN 104751473 A 10/2015

OTHER PUBLICATIONS

Haizhou Qu et al., Research Progress on the Pores of Microbial Carbonate Rocks, Acta Sedimentologica Sinica, 2018, vol. 36, Issue (4), pp. 651-663.

* cited by examiner

METHOD AND DEVICE FOR CHARACTERIZING MICROBIAL CARBONATE PORES, AND SERVER

CROSS-REFERENCE TO RELATED APPLICATIONS

This US non-provisional patent application claims benefit and priority to Chinese patent application No. 201910826417.6 filed, Sep. 2, 2019, pursuant to 35 U.S.C. § 119, the contents of which are incorporated by reference as if fully set forth herein and for all purposes.

TECHNICAL FIELD

The present invention relates to the technical field of carbonate analysis, in particular to a method and device for characterizing microbial carbonate pores, and a server.

BACKGROUND

Microbial carbonate is formed by the growth and metabolism of benthic microorganisms, including bacteria, fungi, small lower algae and some small protozoa, which induce carbonate precipitation or capture and bond detrital particles. Microbial carbonate is not only an important carrier for the reconstruction of the paleoenvironment, but also a potential oil and gas reservoir. The existing microbial carbonate pore characterization method usually includes: visual observation, sampling and testing according to the requirements of the experimental instrument to obtain pore parameter data. This method is less accurate and is difficult to comprehensively and systematically realize the characterization of the microbial carbonate pores.

SUMMARY

In view of this, to improve the accuracy and comprehensiveness of microbial carbonate pore characterization, the present invention aims to provide a method and device for characterizing microbial carbonate pores, and a server.

In a first aspect, the present invention provides a method for characterizing microbial carbonate pores, including: acquiring a user's detailed observational description of a profile of a microbial carbonate to be analyzed; determining a full-diameter core sample on the microbial carbonate according to the detailed observational description of the profile; performing pore characterization and a first pore test on the full-diameter core sample to determine a centimeter-scale pore parameter; determining a sampling position on the full-diameter core sample according to the centimeter-scale pore parameter; sampling on the full-diameter core sample according to the sampling position to obtain a plunger sample; performing a second pore test on the plunger sample to determine a millimeter-scale pore parameter; determining a sampling position on the plunger sample according to the millimeter-scale pore parameter; sampling on the plunger sample according to the sampling position to obtain a thin section sample and an electron scanning microscope (SEM) sample; performing a third pore test on the thin section sample to determine a micron-scale pore parameter; and performing a fourth pore test on the SEM sample by using an SEM to determine a nanoscale pore parameter.

With reference to the first aspect, in a first possible implementation manner of the first aspect, the performing pore characterization and a first pore test on the full-diameter core sample to determine a centimeter-scale pore parameter includes: characterizing surface pores, cavities and fissures of the full-diameter core sample; performing nuclear magnetic resonance imaging (NMRI) on the full-diameter core sample to obtain an NMR image; and determining a centimeter-scale pore parameter according to the NMR image and the characterization of the surface pores, cavities and fissures.

With reference to the first aspect, in a second possible implementation manner of the first aspect, the performing a second pore test on the plunger sample to determine a millimeter-scale pore parameter includes: performing a computed tomography (CT) scan on the plunger sample to obtain a scanned image; and determining a millimeter-scale pore parameter according to the scanned image.

With reference to the first aspect, in a third possible implementation manner of the first aspect, the performing a third pore test on the thin section sample to determine a micron-scale pore parameter includes: scanning the thin section sample by using a polarizing microscope to obtain a microscope pore image; and determining a micron-scale pore parameter according to the microscope pore image.

With reference to the first aspect, in a fourth possible implementation manner of the first aspect, the method further includes: testing the thin section sample through electron probe microanalysis or cathodoluminescence (CL) to obtain depositional and diagenetic fabric characteristics of the microbial carbonate.

In a second aspect, the present invention provides a device for characterizing microbial carbonate pores, including: an acquisition module of the detailed observational description of a profile, for acquiring a user's detailed observational description of a profile of a microbial carbonate to be analyzed; a full-diameter core sample determination module, for determining a full-diameter core sample on the microbial carbonate according to the detailed observational description of the profile; a centimeter-scale pore test module, for performing pore characterization and a first pore test on the full-diameter core sample to determine a centimeter-scale pore parameter; a first sampling position determination module, for determining a sampling position on the full-diameter core sample according to the centimeter-scale pore parameter; a first sampling module, for sampling on the full-diameter core sample according to the sampling position to obtain a plunger sample; a millimeter-scale pore test module, for performing a second pore test on the plunger sample to determine a millimeter-scale pore parameter; a second sampling position determination module, for determining a sampling position on the plunger sample according to the millimeter-scale pore parameter; a second sampling module, for sampling on the plunger sample according to the sampling position to obtain a thin section sample and an SEM sample; a micron-scale pore test module, for performing a third pore test on the thin section sample to determine a micron-to-nanoscale pore parameter; and a nanoscale pore test module, for performing a fourth pore test on the SEM sample by using an SEM to determine a nanoscale pore parameter.

With reference to the second aspect, in a first possible implementation manner of the first aspect, the centimeter-scale pore test module is further used for: characterizing surface pores, cavities and fissures of the full-diameter core sample; performing NMRI on the full-diameter core sample to obtain an NMR image; and determining a centimeter-scale pore parameter according to the NMR image and the characterization of the surface pores, cavities and fissures.

With reference to the second aspect, in a second possible implementation manner of the first aspect, the millimeter-scale pore test module is further used for: performing a CT scan on the plunger sample to obtain a scanned image; and determining a millimeter-scale pore parameter according to the scanned image.

With reference to the second aspect, in a third possible implementation manner of the first aspect, the micron-scale pore test module is further used for: scanning the thin section sample by using a polarizing microscope to obtain a microscope pore image; and determining a micron-scale pore parameter according to the microscope pore image. In a third aspect, the present invention provides a server, including a processor and a memory, where the memory stores a machine-executable instruction that can be executed by the processor; the processor executes the machine-executable instruction to implement the above method for characterizing microbial carbonate pores.

The examples of the present invention have the following beneficial effects: The examples of the present invention provide a method and device for characterizing microbial carbonate pores, and a server. The method includes: acquiring a user's detailed observational description of a profile of a microbial carbonate to be analyzed, and determining a full-diameter core sample on the microbial carbonate; performing pore characterization and a first pore test on the full-diameter core sample to determine a centimeter-scale pore parameter; determining a sampling position on the full-diameter core sample according to the centimeter-scale pore parameter, and sampling on the full-diameter core sample to obtain a plunger sample; performing a second pore test on the plunger sample to determine a millimeter-scale pore parameter; determining a sampling position on the plunger sample according to the millimeter-scale pore parameter, and sampling on the plunger sample to obtain a thin section sample and a scanning electron microscope (SEM) sample; performing a third pore test on the thin section sample to determine a micron-scale pore parameter; and performing a fourth pore test on the SEM sample by using an SEM to determine a nanoscale pore parameter. The method improves the accuracy and comprehensiveness of microbial carbonate pore characterization.

Other features and advantages of the present invention will be described in the following part of the specification, or part of the features and advantages can be inferred from the specification or determined without doubt, or can be derived by implementing the above-mentioned technology of the present invention.

In order to make the above objectives, features and advantages of the present invention more understandable, the preferred implementations of the present invention are described in detail below with reference to the accompanying drawings.

BRIEF DESCRIPTION OF DRAWINGS

To describe the technical solutions in the specific implementations of the present invention or the prior art more clearly, the accompanying drawings required for describing the specific implementations or the prior art are briefly described below. Apparently, the accompanying drawings in the following description show merely some implementations of the present invention, and a person of ordinary skill in the art may still derive other accompanying drawings from these accompanying drawings without creative efforts.

DETAILED DESCRIPTION

In order to make the objectives, technical solutions and advantages of the examples of the present invention clearer, the technical solutions in the present invention are described clearly and completely below with reference to the accompanying drawings. Apparently, the described examples are some rather than all of the examples. All other examples obtained by a person of ordinary skill in the art based on the examples of the present invention without creative efforts should fall within the protection scope of the present invention.

At present, the existing microbial carbonate pore characterization method usually includes naked eye observation and scanning, and the obtained characterization results are rough and not comprehensive. In view of this, the examples of the present invention provide a method and device for characterizing microbial carbonate pores, and a server, which can be used for pore analysis of microbial carbonate and other rocks.

In order to make the present invention more comprehensible, a method for characterizing microbial carbonate pores disclosed by an example of the present invention is first described in detail.

Figure 1:
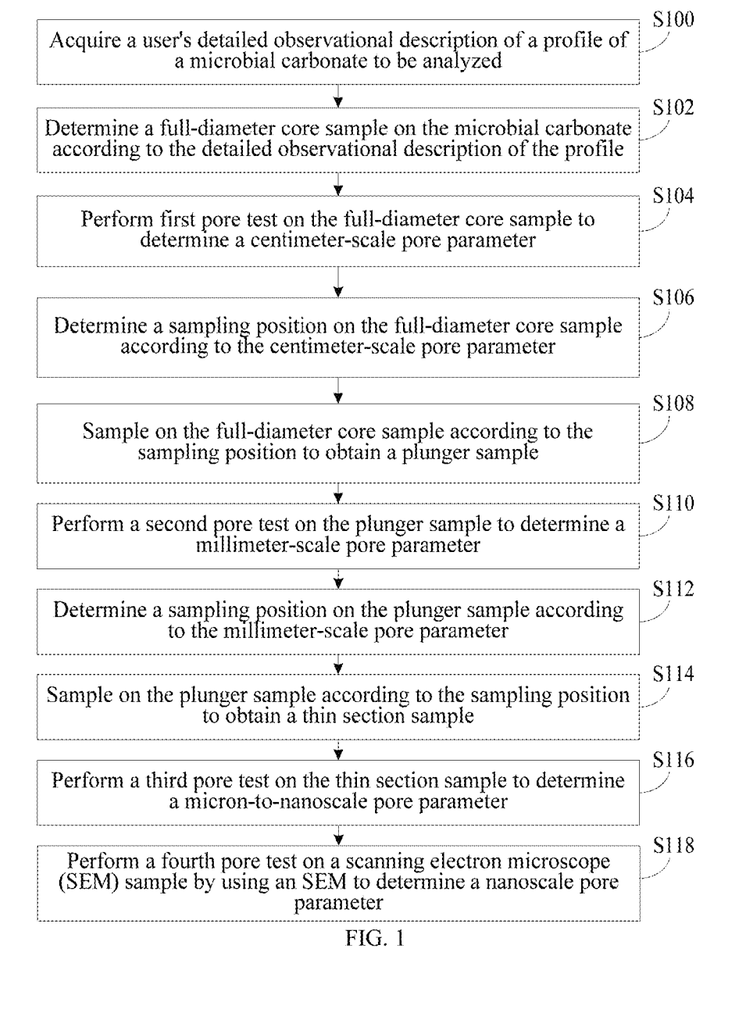
FIG. 1 is a flowchart of a method for characterizing microbial carbonate pores according to an example of the present invention.

The example of the present invention provides a method for characterizing microbial carbonate pores. As shown in FIG. 1 (flowchart), the method includes the following steps:

S100: Acquire a user's detailed observational description of a profile of a microbial carbonate to be analyzed.

The detailed observational description of the profile may usually be performed by those skilled in the art. They observe the microbial carbonate to be analyzed based on their knowledge and describe some characteristics of the microbial carbonate. The finely observed and described characteristics of the profile may include the type, content and distribution of different components in the rock, the type, size and shape of pores, the properties and characteristics of the internal filling within the pores, the apparent porosity (an area ratio of pores to the rock) and the spatial distribution characteristics of other components, etc.

S102: Determine a full-diameter core sample on the microbial carbonate according to the detailed observational description of the profile.

The full-diameter core sample may be determined on the microbial carbonate to be analyzed, based on the type, size, shape and apparent porosity of pores according to the detailed observational description of the profile. In order to analyze the characteristics of the microbial carbonate pores more comprehensively, macroscopic centimeter-scale and millimeter-scale pores and surrounding dense parts with no macroscopic pores are usually included as a full-diameter core sample for follow-up analysis and processing.

S104: Perform pore characterization and a first pore test on the full-diameter core sample to determine a centimeter-scale pore parameter.

The centimeter-scale pore parameter may include type, shape, pore size, apparent porosity and distribution of pores. The technical means for qualitative and quantitative characterization of pores generally include computed tomography (CT) scan, nuclear magnetic resonance (NMR), thin section casting, scanning electron microscopy and image analysis, which are selected according to different scales of pores. Step S104 may be implemented as follows:

(1) Characterize surface pores, cavities and fissures of the full-diameter core sample.

(2) Perform nuclear magnetic resonance imaging (NMRI) on the full-diameter core sample to obtain an NMR image.

(3) Determine a centimeter-scale pore parameter according to the NMR image and the characterization of the surface pores, cavities and fissures; specifically, obtain centimeter-scale pore parameter data from the NMR image, and integrate the data to obtain the centimeter-scale pore parameter.

S106: Determine a sampling position on the full-diameter core sample according to the centimeter-scale pore parameter.

A relevant millimeter-scale pore parameter may be obtained in the centimeter-scale pore test process. However, the relevant parameter is not accurate, so further sampling is required for a millimeter-scale pore test. A position where the number and distribution of millimeter-scale pores reach a set threshold may be selected as the sampling position.

S108: Sample on the full-diameter core sample according to the sampling position to obtain a plunger sample.

The plunger sample refers to a small diameter cylinder prepared from a test sample. It is drilled from the full-diameter core sample after the sampling position is determined. When there is more than one sampling position, a plurality of plunger samples corresponding to the sampling positions are drilled.

S110: Perform a second pore test on the plunger sample to determine a millimeter-scale pore parameter.

When the millimeter-scale pore test is performed, CT scan or NMRI can be selected for operation. When CT scan is selected, step S110 is specifically implemented as follows:

(1) Perform a CT scan on the plunger sample to obtain a scanned image.

(2) Determine a millimeter-scale pore parameter according to the scanned image; specifically, obtain millimeter-scale pore parameter data from the CT scanned image, and integrate the data to obtain the millimeter-scale pore parameter.

S112: Determine a sampling position on the plunger sample according to the millimeter-scale pore parameter.

Micron-to-nanoscale pores are invisible to the naked eye, and are usually hard to be characterized by data obtained by CT scan and NMR. Therefore, a position where the diameter or distribution of millimeter-scale pores is smaller than a set threshold may be selected as a sampling position.

S114: Sample on the plunger sample according to the sampling position to obtain a thin section sample and a scanning electron microscope (SEM) sample; specifically, sample at the sampling position on the tested plunger sample by cutting and grinding to obtain a casting thin section sample and an SEM sample, where the thickness and diameter of the casting thin section sample are determined based on experimental experience, and the size of the SEM sample must meet the test requirements of an instrument.

S116: Perform a third pore test on the thin section sample to determine a micron-scale pore parameter.

When micron-to-nanoscale pores are tested, the resolution of the adopted technical means needs to be considered, and microscopic examination may be used in actual operation. Step S116 may be implemented as follows:

(1) Scan the thin section sample by using a polarizing microscope to obtain a microscope pore image.

(2) Determine a micron-scale pore parameter according to the microscope pore image.

S118: Perform a fourth pore test on the SEM sample by using an SEM to determine a nanoscale pore parameter; specifically, obtain nanoscale pore parameter data from an SEM image, and integrate the data to obtain the nanoscale pore parameter.

In addition, when it is necessary to analyze the depositional and diagenetic fabrics of the microbial carbonate, the thin section sample may further be tested through electron probe microanalysis or cathodoluminescence (CL) to obtain the depositional and diagenetic fabric characteristics of the microbial carbonate.

The example of the present invention provides a method for characterizing microbial carbonate pores. The method includes: acquire a user's detailed observational description of a profile of a microbial carbonate to be analyzed, and determine a full-diameter core sample on the microbial carbonate; perform pore characterization and a first pore test on the full-diameter core sample to determine a centimeter-scale pore parameter; determine a sampling position on the full-diameter core sample according to the centimeter-scale pore parameter, and sample on the full-diameter core sample to obtain a plunger sample; perform a second pore test on the plunger sample to determine a millimeter-scale pore parameter; determine a sampling position on the plunger sample according to the millimeter-scale pore parameter, and sample on the plunger sample to obtain a thin section sample and an SEM sample; perform a third pore test on the thin section sample to determine a micron-scale pore parameter; and perform a fourth pore test on the SEM sample by using an SEM to determine a nanoscale pore parameter. The method improves the accuracy and comprehensiveness of microbial carbonate pore characterization.

Figure 2:
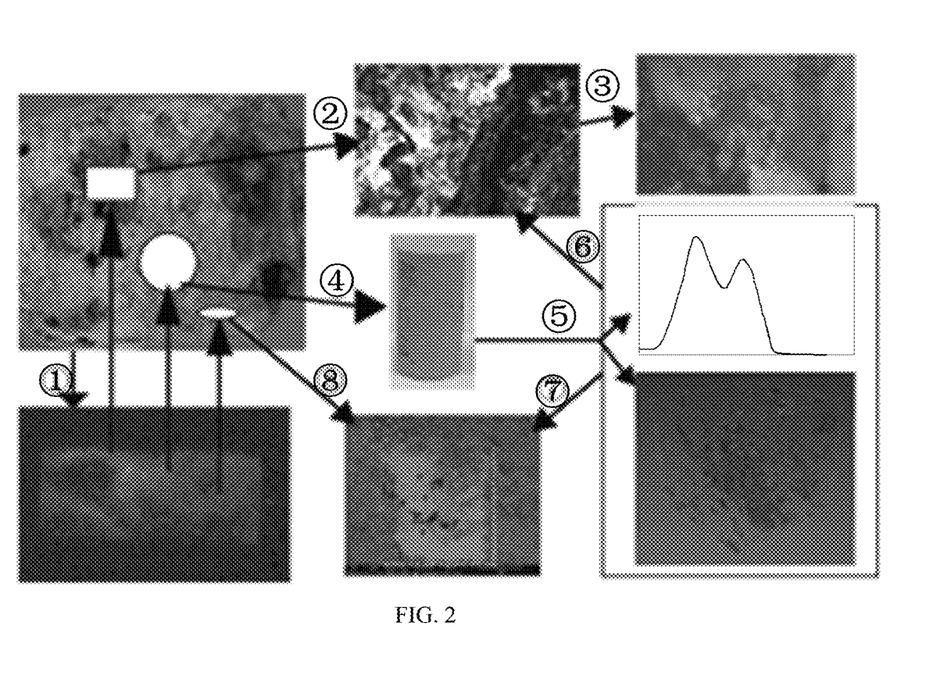
FIG. 2 is a schematic of a method for systematically characterizing multi-scale microbial carbonate pores according to an example of the present invention.

An example of the present invention further provides a method for systematically characterizing multi-scale microbial carbonate pores. This method is implemented based on the method shown in FIG. 1, and specifically includes the following steps:

(1) Perform detailed observational description of a field profile.

(2) Select a typical full-diameter microbial carbonate core according to the description, and perform NMRI and test pore size distribution to obtain parameters and distribution positions of macroscopic pores (steps (1) and (2) of a schematic of the method for systematically characterizing multi-scale microbial carbonate pores shown in FIG. 2).

(3) Drill a plunger sample according to a depositional fabric (step (4) in FIG. 2), and perform a CT scan (step (7) in FIG. 2) or an NMR test (step (5) in FIG. 2) to obtain data such as meso-micropore size distribution and spatial distribution.

(4) Use the tested plunger sample and other typical parts of the core to grind casting thin sections, with an interval of no more than 5 cm, and obtain data such as type, shape, size and apparent porosity of pores through identification and image analysis (step (6) in FIG. 2).

(5) Perform CL, electron probe microanalysis and in-situ microelement test on the typical samples to identify microbial-related depositional and diagenetic fabric characteristics and parameters (step (3) in FIG. 2).

(6) Observe the typical samples by using an SEM (step (8) in FIG. 2), and analyze the characteristics of microfabric, micron and even nanoscale micropores.

Figure 3:
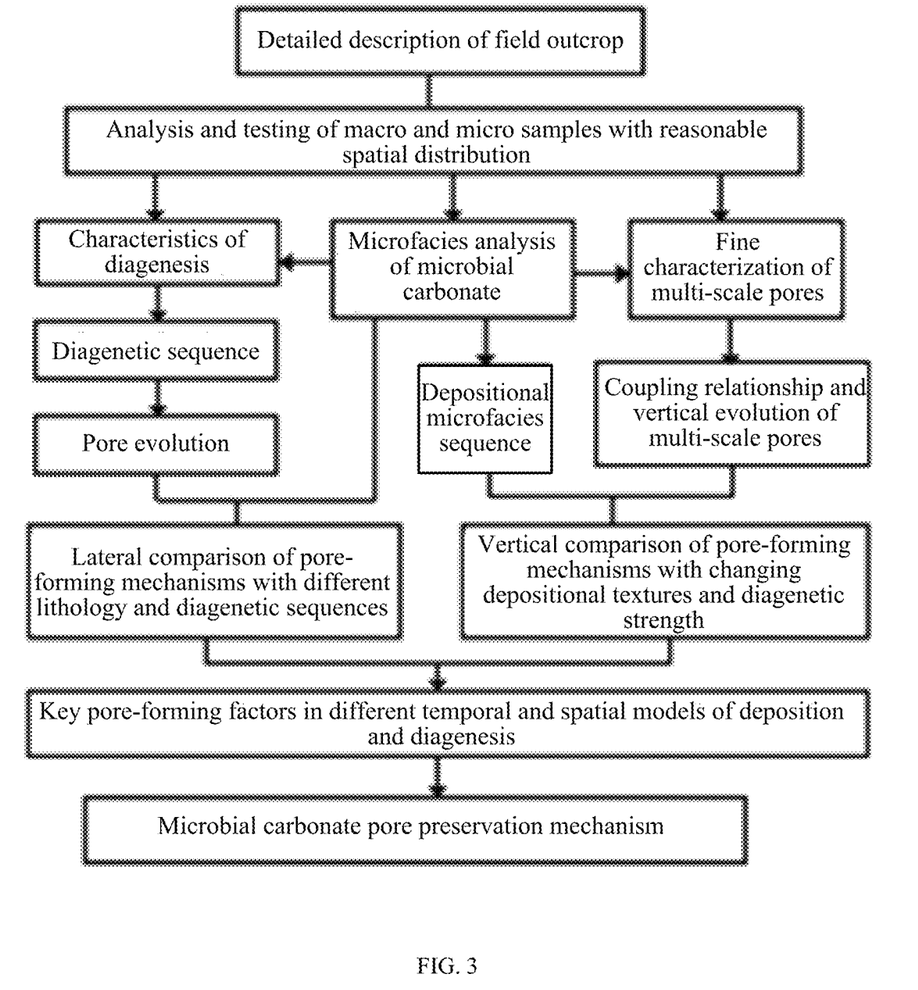
FIG. 3 is a flowchart of determining whether a rock is able to store oil and gas according to an example of the present invention.

In addition, based on the fine description of the field outcrop, it is possible to carry out comprehensive analysis and testing of macro and micro samples with reasonable spatial distribution, so as to obtain the distribution characteristics of different scales of pores in an entirely sampled rock. The above method can be used to perform fine characterization of multi-scale pores in a process of determining whether a rock is able to store oil and gas. The process of determining whether a rock is able to store oil and gas is shown in FIG. 3. It is mainly divided into three parts. A first part is to obtain a diagenetic sequence based on the characteristics of diagenesis, and then to obtain pore evolution. A second part is to form a depositional microfacies sequence through microfacies analysis of the microbial carbonate. A third part includes: finely characterize multi-scale pores, and determine a coupling relationship and vertical evolution of the multi-scale pores; perform lateral comparison of pore-forming mechanisms with different lithology and diagenetic sequences according to the microfacies analysis and pore evolution of the microbial carbonate; perform vertical comparison of pore-forming mechanisms with changing depositional textures and diagenetic strength according to the depositional microfacies sequence and the coupling relationship and vertical evolution of the multi-scale pores; and obtain key pore-forming factors in different temporal and spatial models of deposition and diagenesis, and finally determine a microbial carbonate pore preservation mechanism. This process can be used to observe an entirely sampled rock in all aspects to obtain the distribution characteristics of pores on various scales. It is an important reference for studying the formation of pores in a rock and determining whether the rock is able to store oil and gas before oil extraction.

Figure 4:
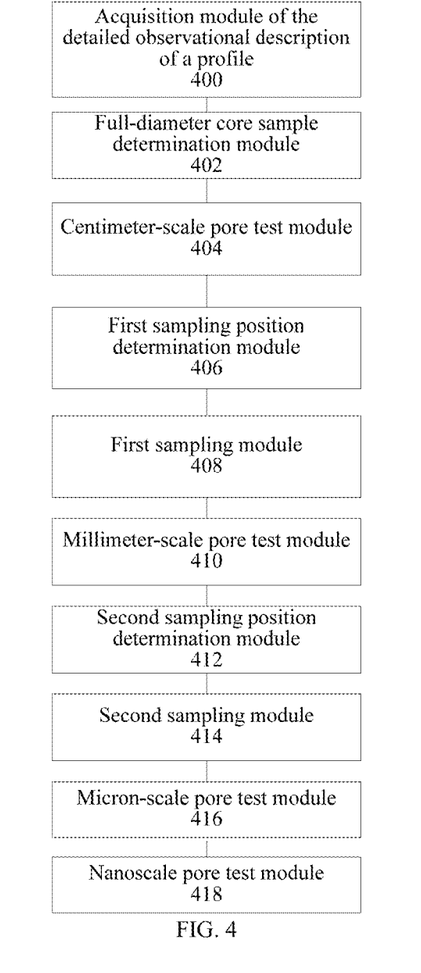
FIG. 4 is a structural diagram of a device for characterizing microbial carbonate pores according to an example of the present invention.

In correspondence to the above example, an example of the present invention provides a device for characterizing microbial carbonate pores. As shown in FIG. 4, the device includes: an acquisition module 400 of the detailed observational description of a profile, for acquiring a user's detailed observational description of a profile of a microbial carbonate to be analyzed; a full-diameter core sample determination module 402, for determining a full-diameter core sample on the microbial carbonate according to the detailed observational description of the profile; a centimeter-scale pore test module 404, for performing pore characterization and a first pore test on the full-diameter core sample to determine a centimeter-scale pore parameter; a first sampling position determination module 406, for determining a sampling position on the full-diameter core sample according to the centimeter-scale pore parameter; a first sampling module 408, for sampling on the full-diameter core sample according to the sampling position to obtain a plunger sample; a millimeter-scale pore test module 410, for performing a second pore test on the plunger sample to determine a millimeter-scale pore parameter; a second sampling position determination module 412, for determining a sampling position on the plunger sample according to the millimeter-scale pore parameter; a second sampling module 414, for sampling on the plunger sample according to the sampling position to obtain a casting thin section sample and an SEM sample; a micron-scale pore test module 416, for performing a third pore test on the casting thin section sample and the SEM sample to determine a micron-to-nanoscale pore parameter; and a nanoscale pore test module 418, for performing a fourth pore test on the SEM sample by using an SEM to determine a nanoscale pore parameter.

In a specific implementation process, centimeter-scale pores may be subjected to NMRI to obtain the centimeter-scale pore parameter. Therefore, the centimeter-scale pore test module is further used for characterizing surface pores, cavities and fissures of the full-diameter core sample, performing NMRI on the full-diameter core sample to obtain an NMR image, and determining a centimeter-scale pore parameter according to the NMR image and the characterization of the surface pores, cavities and fissures.

In a specific implementation process, millimeter-scale pores may be subjected to a CT scan to obtain the millimeter-scale pore parameter. Therefore, the millimeter-scale pore test module is further used for performing a CT scan on the plunger sample to obtain a scanned image, and determining a millimeter-scale pore parameter according to the scanned image.

In a specific implementation process, micron-scale pores may be scanned by using a polarizing microscope to obtain the micron-scale pore parameter. Therefore, the micron-scale pore test module is further used for scanning the casting thin section by using a polarizing microscope to obtain a microscope pore image, and determining a micron-scale pore parameter according to the microscope pore image.

Further, when it is necessary to analyze the depositional and diagenetic fabrics of the microbial carbonate, the device may further include a fabric test module, for testing the thin section sample through electron probe microanalysis or CL to obtain depositional and diagenetic fabric characteristics of the microbial carbonate.

The device for characterizing microbial carbonate pores and the method for characterizing microbial carbonate pores provided by the examples of the present invention have the same technical features, and thus can solve the same technical problems and achieve the same technical effects.

Figure 5:
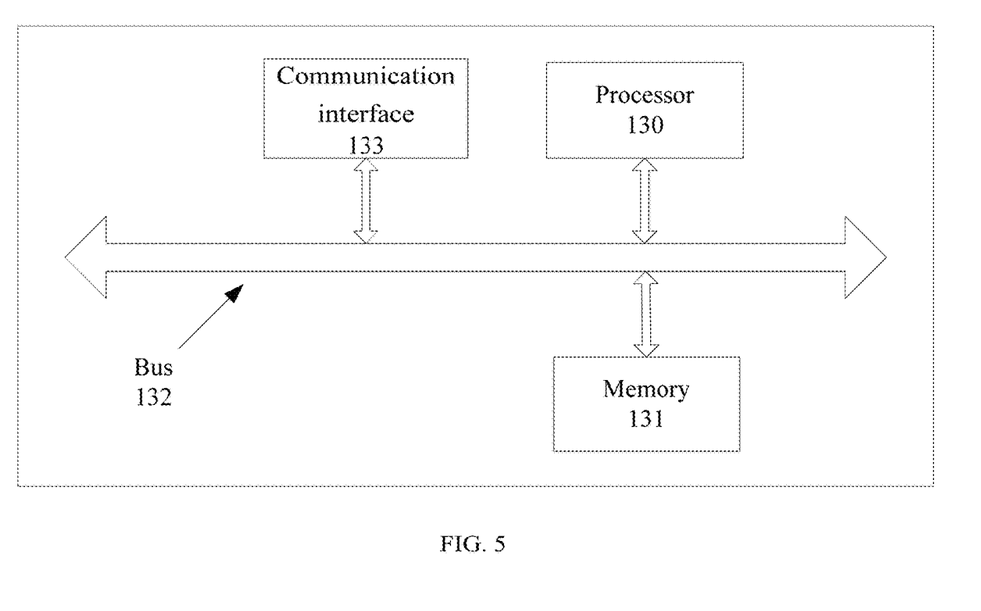
FIG. 5 is a structural diagram of a server according to an example of the present invention.

An example of the present invention further provides a server. As shown in FIG. 5, the server includes a processor 130 and a memory 131. The memory 131 stores a machine-executable instruction that can be executed by the processor 130, and the processor 130 executes the machine-executable instruction to implement the method for characterizing microbial carbonate pores.

Further, the server shown in FIG. 5 includes a bus 132 and a communication interface 133. The processor 130, the communication interface 133 and the memory 131 are connected through the bus 132.

The memory 131 may include a high-speed random access memory (RAM), and may also include a non-volatile memory (NVM), such as at least one disk memory. The communication connection between a system network element and at least one other network element is realized through at least one communication interface 133 (which may be wired or wireless), and Internet, a wide area network, a local network, a metropolitan area network, etc. may be used. The bus 132 may be an industry standard architecture (ISA) bus, a peripheral component interconnect (PCI) bus or an extended industry standard architecture (EISA) bus. The bus may be divided into address bus, data bus and control bus, etc. For convenience of presentation, only one bidirectional arrow is used to represent the bus in FIG. 5, but it does not mean that there is only one bus or one type of bus.

The processor 130 may be an integrated circuit (IC) chip capable of signal processing. In the implementation process, the steps of the method may be completed through an integrated logic circuit of hardware in the processor 130 or an instruction in the form of software. The processor 130 may be a general-purpose processor, including central processing unit (CPU) and network processor (NP), etc. It may also be a digital signal processor (DSP), an application specific integrated circuit (ASIC), a field-programmable gate array (FPGA) or other programmable logic device, discrete gate or transistor logic device and discrete hardware component. The processor can implement or execute the methods, steps and logical block diagrams disclosed by the examples of the present invention. The general-purpose processor may be a microprocessor or any conventional processor. The steps of the methods disclosed by the examples of the present invention may be directly executed by a hardware decoding processor, or executed by a combination of hardware and software modules in the decoding processor. The software module may be located in a mature storage medium in the art, such as RAM, flash memory, read-only memory (ROM), programmable ROM, electrically erasable programmable memory or register. The storage medium is located in the memory 131. The processor 130 reads the information in the memory 131, and completes the steps of the methods of the above examples through its hardware.

An example of the present invention further provides a machine-readable storage medium. The machine-readable storage medium stores a machine-executable instruction. When the machine-executable instruction is called and executed by the processor, the machine-executable instruction enables the processor to implement the method for characterizing microbial carbonate pores. For specific implementation, please refer to the method examples, which will not be repeated here.

An example of the present invention further provides a computer program product for the method and device for characterizing microbial carbonate pores, and a server. The computer program product includes a computer-readable storage medium storing a program code. The program code includes an instruction that can be used to execute the methods described in the above method examples. For specific implementation, please refer to the method examples, which will not be repeated here.

If the function is implemented in the form of a software functional unit and sold or used as an independent product, it can be stored in a computer readable storage medium. Based on such understanding, the technical solution of the present invention which is essential or a part contributing to the prior art or a part of the technical solution may be embodied in the form of a software product. The computer software product is stored in a storage medium and includes a plurality of instructions for enabling a computer device (which may be a personal computer (PC), a server, or a network device) to execute all or some steps of the methods according to each example of the present invention. The storage medium includes a universal serial bus (USB) flash disk, a mobile hard disk, an ROM, an RAM, a magnetic disk, or an optical disk, which can store the program code.

Finally, it should be noted that the above examples are merely specific implementations of the present invention, and are used to describe rather than limiting the technical solutions of the present invention. The protection scope of the present invention is not limited thereto. Although the present invention is described in detail with reference to the above examples, it should be understood that a person of ordinary skill in the art can still make modifications to or readily figure out changes in the technical solutions described in the above examples, or make equivalent substitutions on some technical features therein. These modifications, changes, or substitutions do not make the essence of the corresponding technical solutions depart from the spirit and scope of the technical solutions of the examples of the present invention, and should all fall within the protection scope of the present invention. Therefore, the protection scope of the present invention should be subject to the protection scope of the claims.

What is claimed is:

1. A method for characterizing microbial carbonate pores, comprising:
    acquiring a user's detailed observational description of a profile of a microbial carbonate to be analyzed;
    determining a full-diameter core sample on the microbial carbonate according to the detailed observational description of the profile;
    performing pore characterization and a first pore test on the full-diameter core sample to determine a centimeter-scale pore parameter;
    determining a first sampling position on the full-diameter core sample according to the centimeter-scale pore parameter;
    sampling on the full-diameter core sample according to the first sampling position to obtain a plunger sample;
    performing a second pore test on the plunger sample to determine a millimeter-scale pore parameter;
    determining a second sampling position on the plunger sample according to the millimeter-scale pore parameter;
    sampling on the plunger sample according to the second sampling position to obtain a thin section sample and an electron scanning microscope (SEM) sample;
    performing a third pore test on the thin section sample to determine a micron-scale pore parameter; and
    performing a fourth pore test on the SEM sample by using an SEM to determine a nanoscale pore parameter.

2. The method according to claim 1, wherein the performing pore characterization and the first pore test on the full-diameter core sample to determine the centimeter-scale pore parameter comprises:
    characterizing surface pores, cavities and fissures of the full-diameter core sample;
    performing nuclear magnetic resonance imaging (NMRI) on the full-diameter core sample to obtain an NMR image; and
    determining the centimeter-scale pore parameter according to the NMR image and the characterization of the surface pores, cavities and fissures.

3. A server, comprising a processor and a memory, wherein the memory stores a machine-executable instruction that can be executed by the processor; the processor executes the machine-executable instruction to implement the method for characterizing microbial carbonate pores according to claim 2.

4. The method according to claim 1, wherein the performing the second pore test on the plunger sample to determine the millimeter-scale pore parameter comprises:
    performing a computed tomography (CT) scan on the plunger sample to obtain a scanned image; and
    determining the millimeter-scale pore parameter according to the scanned image.

5. A server, comprising a processor and a memory, wherein the memory stores a machine-executable instruction that can be executed by the processor; the processor configured to execute the machine-executable instruction to implement the method for characterizing microbial carbonate pores according to claim 4.

6. The method according to claim 1, wherein the performing the third pore test on the thin section sample to determine the micron-scale pore parameter comprises:
scanning the thin section sample by using a polarizing microscope to obtain a microscope pore image; and
determining the micron-scale pore parameter according to the microscope pore image.

7. A server, comprising a processor and a memory, wherein the memory stores a machine-executable instruction that can be executed by the processor; the processor configured to execute the machine-executable instruction to implement the method for characterizing microbial carbonate pores according to claim 6.

8. The method according to claim 1, further comprising: testing the thin section sample through electron probe microanalysis or cathodoluminescence (CL) to obtain depositional and diagenetic fabric characteristics of the microbial carbonate.

9. A server, comprising a processor and a memory, wherein the memory stores a machine-executable instruction that can be executed by the processor; the processor configured to execute the machine-executable instruction to implement the method for characterizing microbial carbonate pores according to claim 8.

10. A server, comprising a processor and a memory, wherein the memory stores a machine-executable instruction that can be executed by the processor; the processor configured to execute the machine-executable instruction to implement the method for characterizing microbial carbonate pores according to claim 1.

11. A device for characterizing microbial carbonate pores, comprising:
an acquisition module of the detailed observational description of a profile, for acquiring a user's detailed observational description of a profile of a microbial carbonate to be analyzed;
a full-diameter core sample determination module, for determining a full-diameter core sample on the microbial carbonate according to the detailed observational description of the profile;
a centimeter-scale pore test module, for performing pore characterization and a first pore test on the full-diameter core sample to determine a centimeter-scale pore parameter;
a first sampling position determination module, for determining a sampling position on the full-diameter core sample according to the centimeter-scale pore parameter;
a first sampling module, for sampling on the full-diameter core sample according to the sampling position to obtain a plunger sample;
a millimeter-scale pore test module, for performing a second pore test on the plunger sample to determine a millimeter-scale pore parameter;
a second sampling position determination module, for determining a sampling position on the plunger sample according to the millimeter-scale pore parameter;
a second sampling module, for sampling on the plunger sample according to the sampling position to obtain a thin section sample and an SEM sample;
a micron-scale pore test module, for performing a third pore test on the thin section sample to determine a micron-to-nanoscale pore parameter; and
a nanoscale pore test module, for performing a fourth pore test on the SEM sample by using an SEM to determine a nanoscale pore parameter.

12. The device according to claim 11, wherein the centimeter-scale pore test module is further used for:
characterizing surface pores, cavities and fissures of the full-diameter core sample;
performing NMRI on the full-diameter core sample to obtain an NMR image; and
determining the centimeter-scale pore parameter according to the NMR image and the characterization of the surface pores, cavities and fissures.

13. The device according to claim 11, wherein the millimeter-scale pore test module is further used for:
performing a CT scan on the plunger sample to obtain a scanned image; and
determining the millimeter-scale pore parameter according to the scanned image.

14. The device according to claim 11, wherein the micron-scale pore test module is further used for:
scanning the thin section sample by using a polarizing microscope to obtain a microscope pore image; and
determining the micron-scale pore parameter according to the microscope pore image.

* * * * *